United States Patent [19]

Manabe

[11] Patent Number: 5,385,858
[45] Date of Patent: Jan. 31, 1995

[54] METHOD FOR FABRICATING SEMICONDUCTOR DEVICE HAVING MEMORY CELL OF STACKED CAPACITOR TYPE

[75] Inventor: Kazutaka Manabe, Tokyo, Japan

[73] Assignee: NEC Corporation, Japan

[21] Appl. No.: 96,728

[22] Filed: Jul. 23, 1993

[30] Foreign Application Priority Data

Jul. 23, 1992 [JP] Japan ................... 4-217202

[51] Int. Cl.⁶ ............................................. H01L 21/70
[52] U.S. Cl. ...................................... 437/52; 437/47; 437/60; 437/919
[58] Field of Search .................... 437/47, 48, 52, 60, 437/919, 981; 257/303

[56] References Cited

U.S. PATENT DOCUMENTS

| | | | |
|---|---|---|---|
| 5,023,683 | 6/1991 | Yamada | 257/306 |
| 5,071,783 | 12/1991 | Taguchi et al. | 437/47 |
| 5,084,405 | 1/1992 | Fazan et al. | 437/52 |
| 5,162,248 | 11/1992 | Dennison et al. | 437/52 |

FOREIGN PATENT DOCUMENTS 1257364 10/1989 Japan .

0094554 4/1990 Japan ..................... 437/52

*Primary Examiner*—Tom Thomas
*Attorney, Agent, or Firm*—Laff, Whitesel, Conte & Saret, Ltd.

[57] ABSTRACT

A method for fabricating a semiconductor device includes the steps of forming a MIS transistor, a contact hole, a sidewall insulating film, a first electrode, a dielectric film and a second electrode. The contact hole is formed by depositing a lower and an upper insulating film to cover the MIS transistor and selectively etching the insulating films to expose an upper surface of one of impurity diffusion layers serving as source/drain regions. The sidewall insulating film is formed by depositing an insulating material film using a material whose etching-back rate is different from that of the material for the upper insulating layer. The etching rate of the upper insulating layer is higher than that for the insulating material film. The etching-back under this etching condition results in the formation of the sidewall insulating film that projects upwardly from the surface of the upper insulating layer. With this configuration, it is possible to increase a surface area of the electrodes of a capacitor.

4 Claims, 6 Drawing Sheets

FIG. IA
PRIOR ART
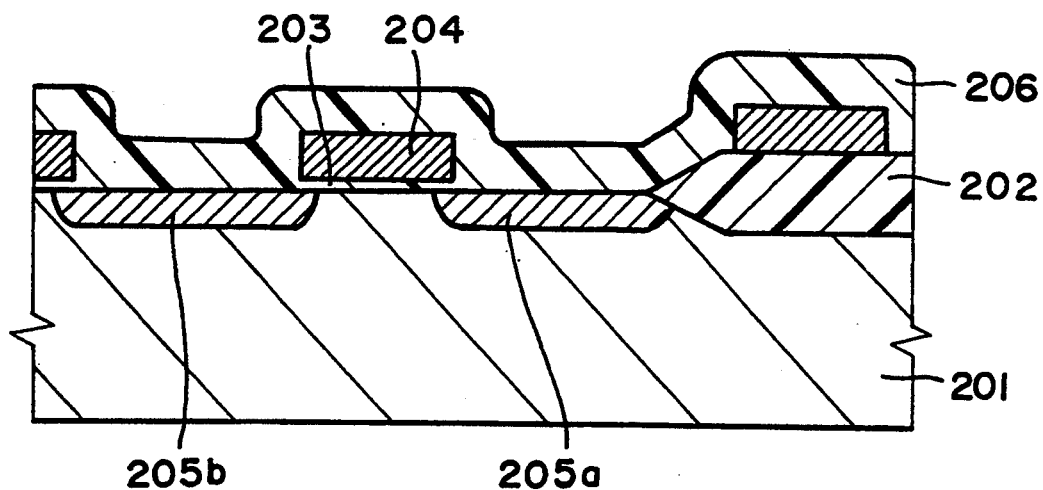
FIG. IB
PRIOR ART
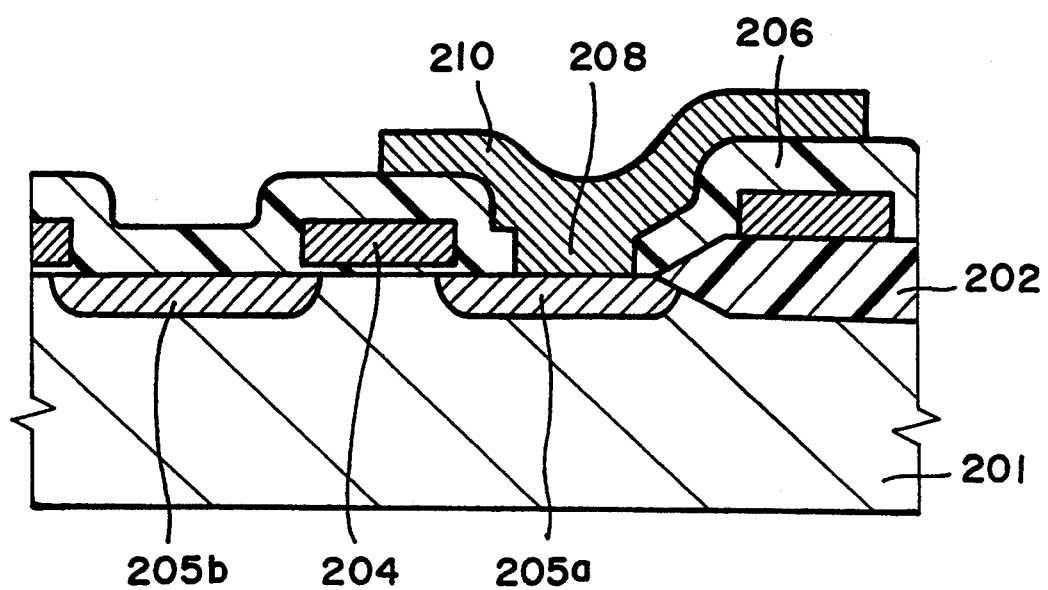

FIG. IC
PRIOR ART
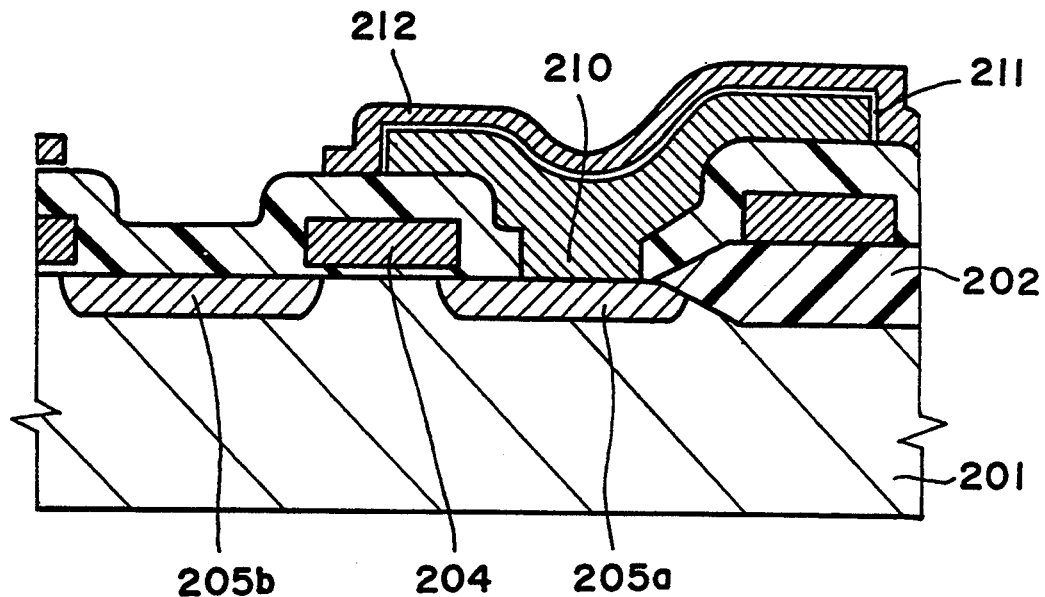
FIG. ID
PRIOR ART
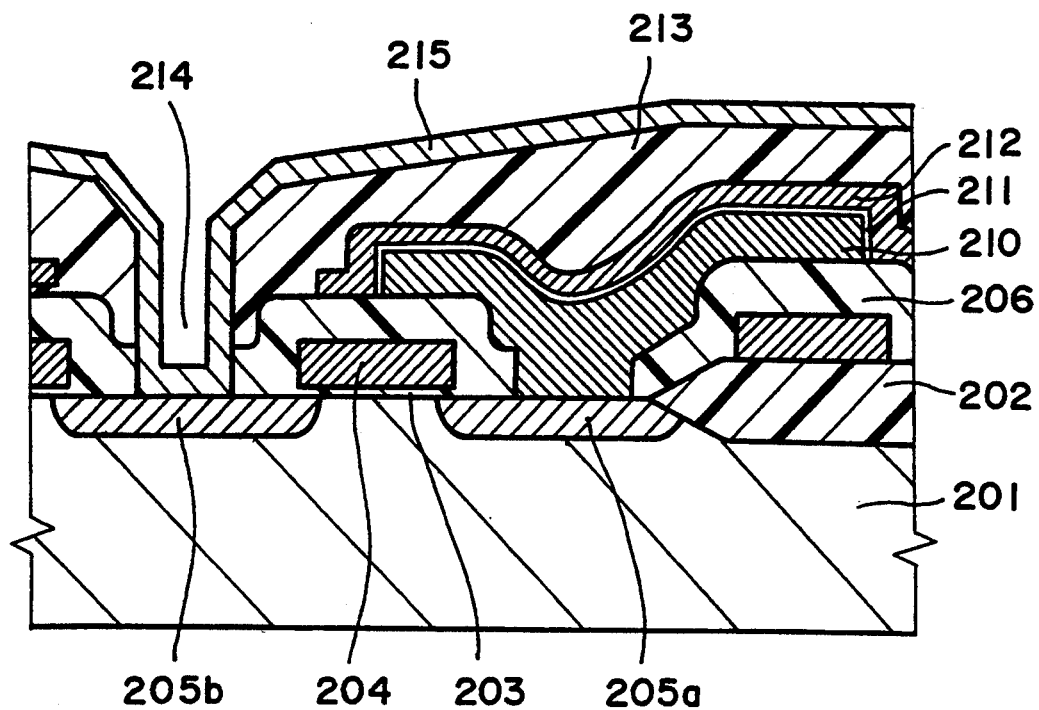

METHOD FOR FABRICATING SEMICONDUCTOR DEVICE HAVING MEMORY CELL OF STACKED CAPACITOR TYPE

BACKGROUND OF THE INVENTION

1. Field of the Invention

The present invention relates to a method for fabricating a semiconductor device, and more particularly to a method for fabricating a semiconductor device with a DRAM memory cell having a metal insulator semiconductor type transistor (hereinafter referred to as "MIS" transistor) as a switching element and a stacked capacitor as a data storing element.

2. Description of the Related Art

A conventional memory cell structure of the kind to which the present invention relates is shown in FIGS. 1A through 1D. With reference to these drawings, the sequential fabrication steps thereof are first explained to assist the understanding of the present invention.

FIG. 1A is first referred to. A surface of a p-type silicon substrate 201 is selectively oxidized thereby forming a field oxide film 202 and, thereafter, a gate oxide film 203 is formed by thermal oxidation in regions where the field oxide film 202 is not formed. Then, a gate electrode 204 is formed by depositing polycrystalline silicon with the resulting film being patterned and, by ion-implantation of phosphor (P), highly doped n-type diffusion layers 205a and 205b used as source/drain regions are formed. A surface of the resulting MIS type transistor is covered with a silicon dioxide film 206.

Next, as seen in FIG. 1B, the silicon dioxide film 206 is selectively etched using a lithography technique thereby forming a first contact hole 208 which exposes a surface of the highly doped n-type diffusion layer 205a. This is followed by the formation of a phosphor doped polycrystalline silicon film which is patterned using a lithography technique to form a storage electrode (a first electrode) 210 of a capacitor which is in contact with the highly doped n-type diffusion layer 205a.

Next, as seen in FIG. 1C, on a surface of the storage electrode 210, there is formed by thermal oxidation a dielectric film 211 on which a phosphor doped silicon film is formed and is patterned into desired patterns using a lithography technique to form a second electrode 212 of the capacitor.

Then, on the resulting film, silicon dioxide is deposited to form an interlayer insulating film 213, and this is followed by the selective etching of the interlayer insulating film 213 and also the silicon dioxide film 206 to form a second contact hole 214 which exposes a surface of the highly doped n-type diffusion layer 205b. Finally, a silicide film is formed and patterned to form a bit line 215, which results in the completion of the conventional memory cell having a stacked capacitor as shown in FIG. 1D.

In the conventional memory cell structure having the stacked capacitor described above, it is difficult, in view of advancement of higher integration and miniaturization, to maintain a sufficient fabrication margin or tolerance to electrically insulate the storage electrode of the capacitor from the gate electrode.

Also, with the conventional arrangement, the fact that the area per unit cell stays small makes it difficult to maintain such capacitance of the capacitor that is demanded of the device and, thus, it is desired that a method be developed so as to be able to increase the capacitance of the capacitor without increasing the cell size involved.

SUMMARY OF THE INVENTION

It is, therefore, an object of the invention to overcome the problems existing in the conventional arrangement and to provide an improved semiconductor device in which, even where the margin between the gate electrode and the storage electrode is reduced, there will be no possibility of the occurrence of short-circuiting between the two electrodes.

It is another object of the invention to enhance the operational reliability of the device by maintaining the required capacitance without increasing the surface area of the memory cell.

According to one aspect of the invention, there is provided a method for fabricating a semiconductor device having a memory cell of stacked capacitor type, the method comprising the steps of:

forming a MIS transistor having a gate electrode on a semiconductor substrate and a pair of first and second impurity diffusion layers constituting source/drain regions;

forming a contact hole by depositing a two-layered insulating film consisting of a lower insulating layer and an upper insulating layer to cover the MIS transistor and selectively etching the two-layered film to expose an upper surface of the first impurity diffusion layer;

forming a sidewall insulating film, which covers an inner wall of the contact hole and a tip of which projects from the upper insulating layer, by depositing an insulating material film using a material different from that for the upper insulating layer on an entire surface including the inner wall of the contact hole and etching-back the insulating material film and the upper insulating layer under an etching condition wherein an etching-back rate of the upper insulating layer is higher than that for the insulating material film;

forming a first electrode, which is in contact with the first impurity diffusion layer and extends partially onto the upper insulating layer, by depositing a conductive material film inside the contact hole and patterning the conductive material film;

forming a dielectric film which covers a surface of the first electrode; and forming a second electrode which covers the first electrode through the dielectric film.

BRIEF DESCRIPTION OF THE DRAWINGS

The above and other objects, features and advantages of the present invention will be apparent from the following description of preferred embodiments of the invention explained with reference to the accompanying drawings, in which:

FIGS. 1A–1D are cross sectional views illustrating the sequential fabrication steps of a conventional semiconductor device.

REFERRED EMBODIMENTS OF THE INVENTION

Now, a method for fabricating a semiconductor device according to a preferred embodiment of the invention will be described with reference to the accompanying drawings.

Figure 2A:
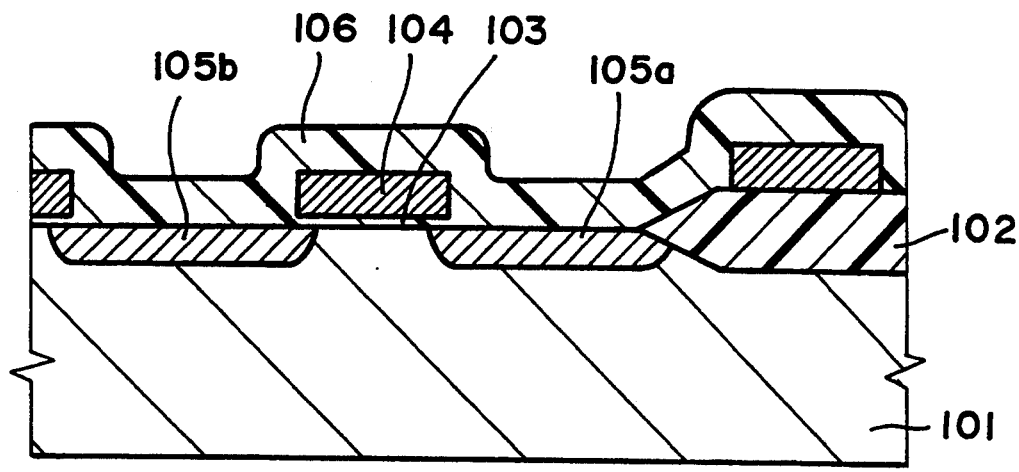
FIGS. 2A–2G are cross sectional views illustrating the sequential fabrication steps of a semiconductor device according to the present invention.
Figure 2B:
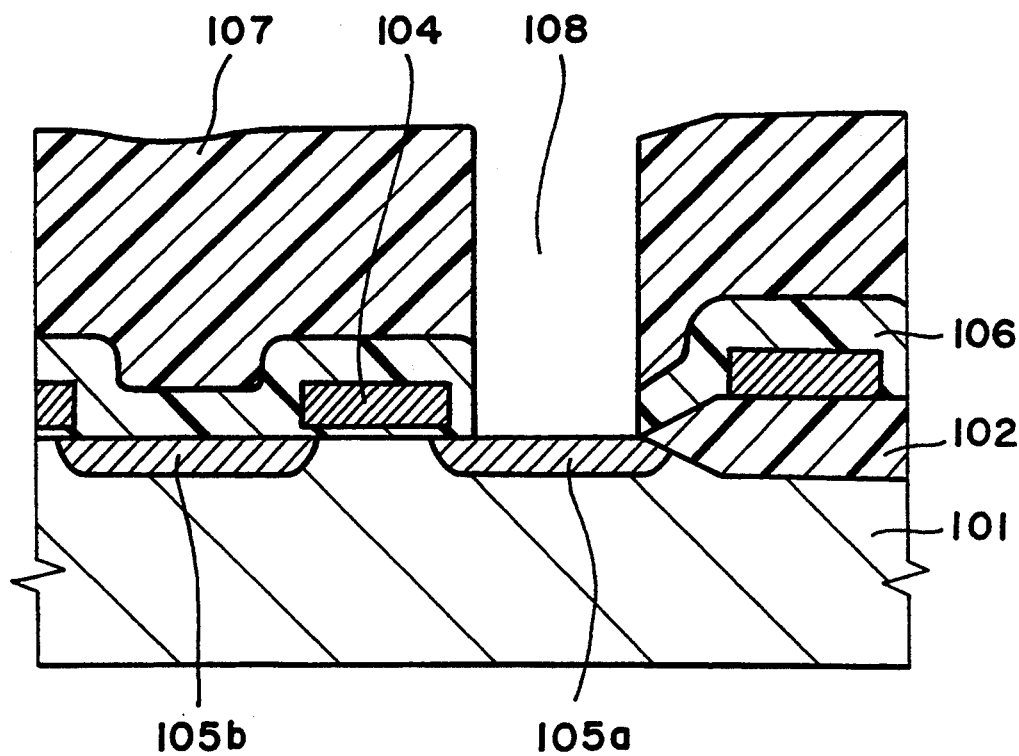
Figure 2C:
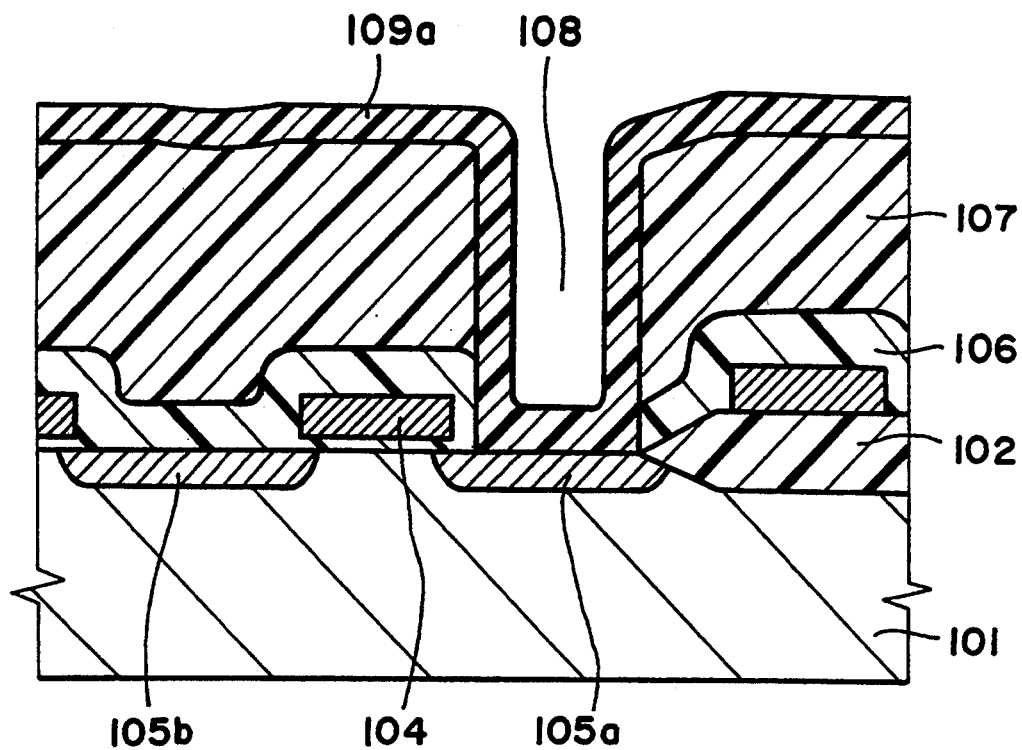
Figure 2D:
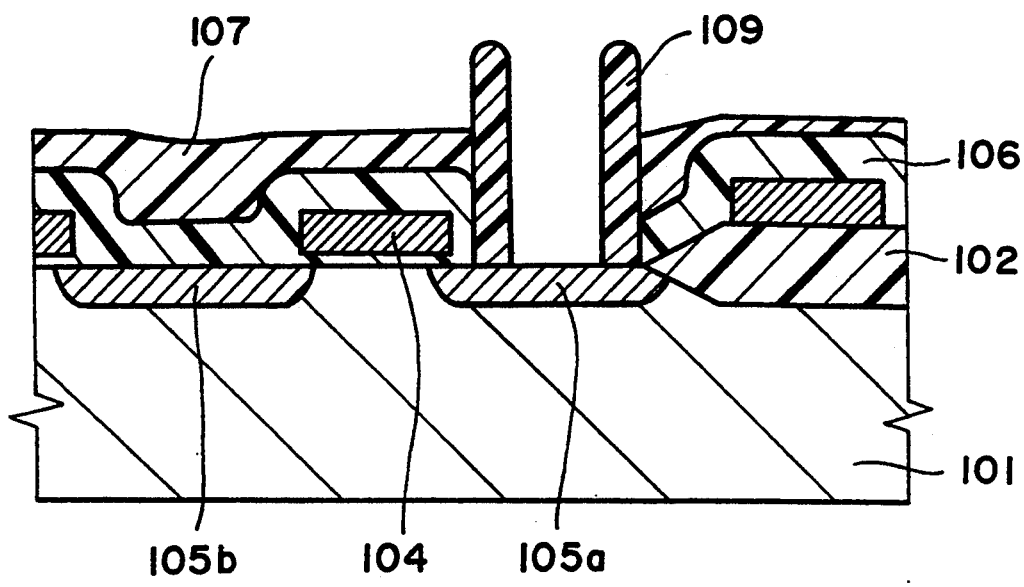
Figure 2E:
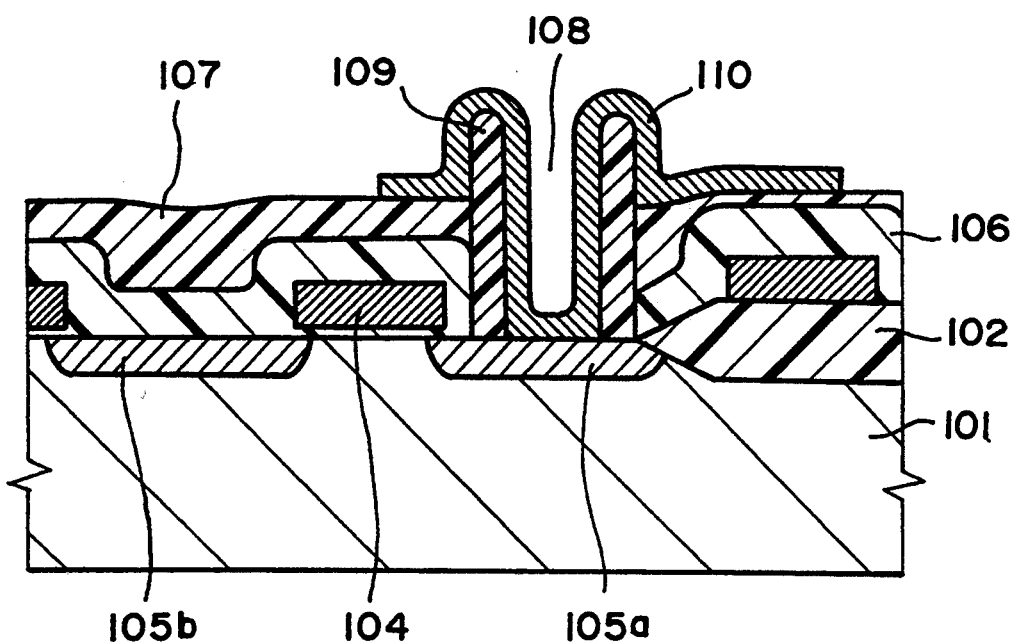
Figure 2F:
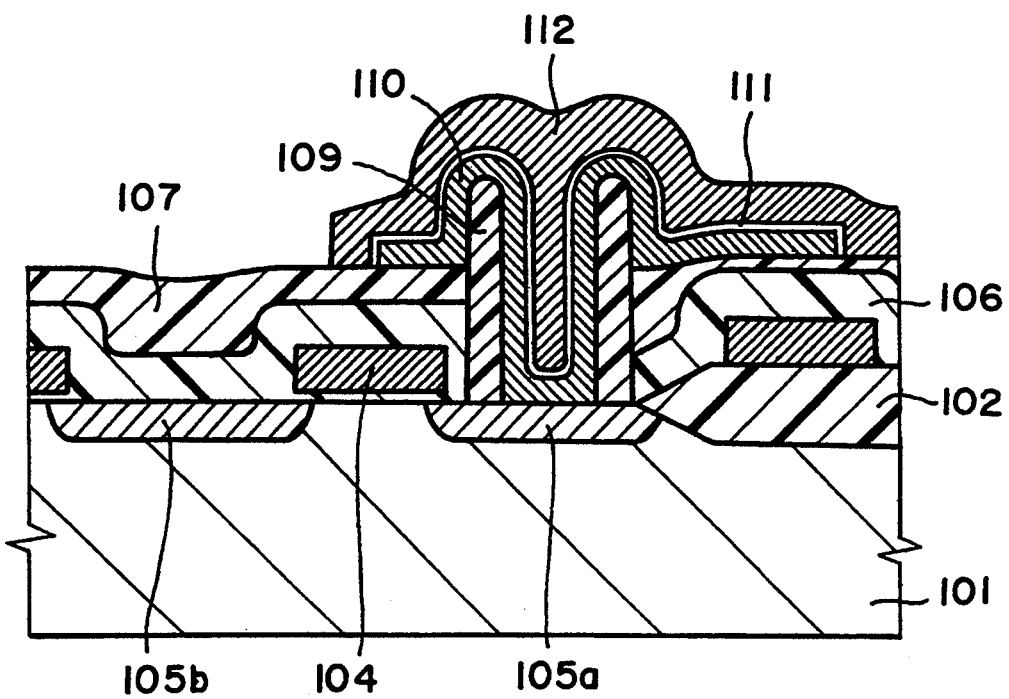
Figure 2G:
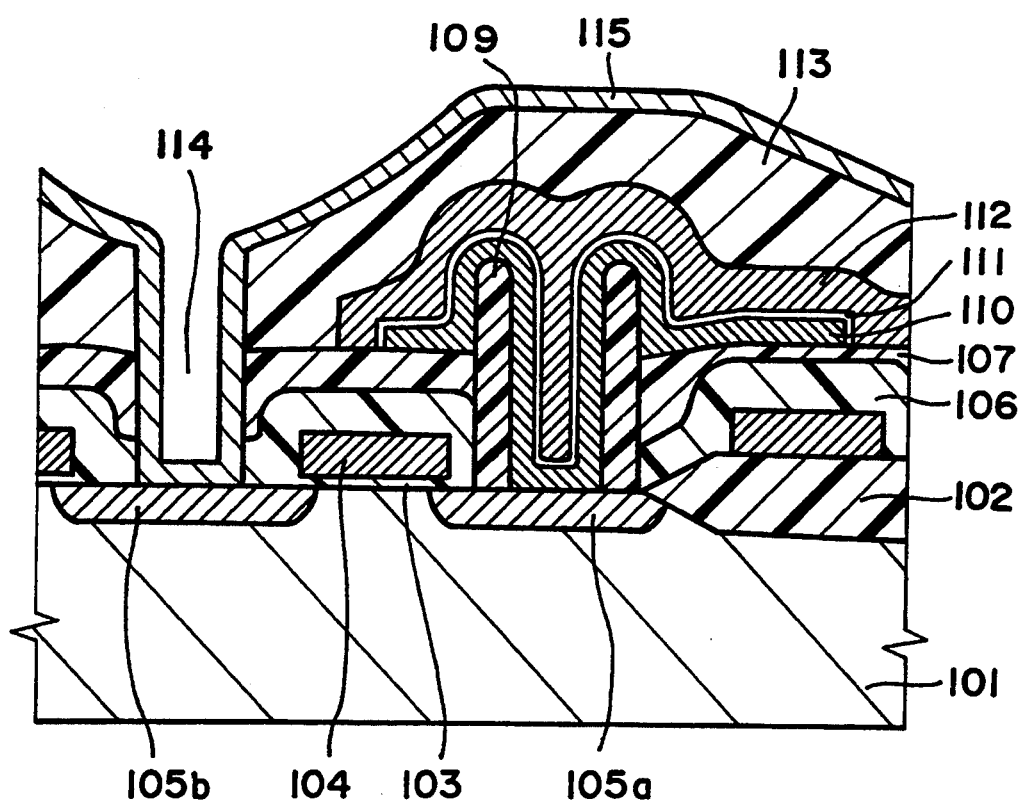

FIG. 2G shows in sectional view the semiconductor device fabricated by the method according to the embodiment of the invention, and FIGS. 2A–2F show in sectional views the related steps of the process for fabrication of the device shown in FIG. 2G.

FIG. 2A is first referred to. In fabricating the device of this embodiment, first a surface of a p-type silicon substrate 101 is selectively oxidized and a field oxide film 102 is formed for element isolation. Then, a gate oxide film 103 having a thickness of 150 Angstroms is formed by thermal oxidation on the portion of the silicon substrate 101 on which no field oxide film 102 is formed. On the entire surface of the resulting film, there is formed a phosphor doped silicon film having a thickness of 2000 Angstroms, which is patterned to form a gate electrode 104 to be used in common with a word line. Also, ion-implantation is performed by using the gate electrode as a mask to form highly doped n-type diffusion layers 105a and 105b which are used as source/drain regions, and this completes the fabrication of a MIS transistor. Then, this MIS transistor is covered with a silicon dioxide film 106 having a thickness of 2000 Angstroms.

Next, as seen in FIG. 2B, on the silicon dioxide film 106, there is formed a borophosphosilicate glass film (BPSG) 107 having a thickness of 8000 Angstroms and, after this film is subjected to a thermal process, a contact hole 108 is formed on the highly doped n-type diffusion layer 105a by means of a lithography technique.

Thereafter, as seen in FIG. 2C, on the entire surface including the inner wall surface of the contact hole 108, there is formed a silicon dioxide film 109a having a thickness of 2000 Angstroms.

Next, FIG. 2D is referred to. By anisotropic dry etching, a flat portion of the silicon dioxide film 109a is completely removed and also the BPSG film 107 is etched-back so that this film is reduced to a thickness of 5000 Angstroms. Due to the difference in an etching-back rate between the BPSG film 107 and the silicon dioxide film 109a, the etching-back results in the formation of sidewall oxide film 109 whose tip projects from the surface of the BPSG film 107 in the inner wall of the contact hole 108.

Thereafter, as seen in FIG. 2E, a phosphor doped polycrystalline silicon film having a thickness of 1000 Angstroms is formed to cover the sidewall oxide film 109 and the BPSG film 107 without fully filling the inside of the first contact hole 108, and this film, after being patterned into desired shapes by using a lithography technique, results in the formation of the first storage electrode 110 of the stacked capacitor electrically connected to the highly doped n-type diffusion layer 105a.

Next, as seen in FIG. 2F, a dielectric film 111 having a thickness of 80 Angstroms is formed by thermal oxidation on a surface of the storage electrode 110 and a phosphor doped polycrystalline silicon film having a thickness of 2000 Angstroms is formed on the dielectric film 111. The phosphor doped polycrystalline film is patterned by using a lithography technique to a pattern covering the storage electrode 110, and this results in the formation of the second electrode 112 which is the other one of the electrodes of the stacked capacitor.

Then, as seen in FIG. 2G, silicon dioxide is deposited to form an interlayer insulating film 113 and, by using a lithography technique, a second contact hole 114 is formed on the highly doped n-type diffusion layer 105b. Finally, a silicide film is deposited and patterned thereby forming a bit line 115 electrically connected to the n-type diffusion layer 105b through the second contact hole 114, and this completes the fabrication of the semiconductor device.

In the above, a preferred embodiment of the invention has been explained but, of course, the invention is not limited to the above embodiment as it can be modified in various ways. For example, the BPSG film 107 may be a PSG (phosphosilicate glass) film and the sidewall insulating film may be a silicon nitride film. Also, the dielectric film 111 may be formed using a CVD (Chemical Vapor Deposition) process or may be a composite film of various different materials.

As explained above, the semiconductor device according to the invention is provided with the sidewall insulating film in the contact hole which interconnects the source/drain region of the MIS type transistor and the storage electrode of the stacked capacitor, which means that the sidewall insulating film is interposed between the gate electrode and the storage electrode and which makes it possible to reduce a margin between the gate electrode and the contact hole. Also, it is made possible to reduce, to below the limit of the lithography technique, an effective cross-sectional area of the contact hole, which contributes to miniaturization of semiconductor devices.

Furthermore, since the storage electrode formed in the contact hole does not fill the entire contact hole and also the sidewall insulating film is projecting upwardly, the surface area of the storage electrode can be increased substantially. Thus, according to the invention, without the need of increasing the memory cell area, it is possible to maintain the sufficient capacitor capacitance that is required by the device, and this enhances the operational stability of the semiconductor devices.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A method for fabricating a semiconductor device having a memory cell of a stacked capacitor type, said method comprising the steps of:

forming a MIS transistor having a gate electrode on a semiconductor substrate and a pair of first and second impurity diffusion layers constituting source/drain regions;

forming a contact hole by depositing a two-layered insulating film consisting of a lower insulating layer and an upper insulating layer to cover said MIS transistor and selectively etching said two-layered film to expose an upper surface of said first impurity diffusion layer;

forming a sidewall insulating film, which covers an inner wall of said contact hole and a tip of which projects from said upper insulating layer, by depositing an insulating material film using a material different from that for said upper insulating layer on an entire surface including said inner wall of said contact hole and etching-back in one step said insulating material film and said upper insulating layer as an etching stopper under an etching condition wherein an etching-back rate of said upper insulating layer is higher than that for said insulating material film and said lower insulating layer;

forming a first electrode, which is in contact with said first impurity diffusion layer and extends partially onto said upper insulating layer, by depositing a conductive material film inside said contact hole and patterning said conductive material film;

forming a dielectric film which covers a surface of said first electrode; and forming a second electrode which covers said first electrode through said dielectric film.

2. A method for fabricating a semiconductor device according to claim 1, in which, in the step of forming said sidewall insulating film inside said contact hole, conductive material is introduced into said contact hole and said conductive material film is formed without said contact hole being fully filled by said conductive material.

3. A method for fabricating a semiconductor device according to claim 1, in which said insulating material film and said lower insulating layer use a silicon dioxide film and said upper insulating layer uses a borophosphosilicate glass film.

4. A method for fabricating a semiconductor device according to claim 1, in which said insulating material film and said lower insulating layer use a silicon nitride and said upper insulating layer uses a phosphosilicate glass film.

* * * * *